United States Patent [19]

Embree

[11] Patent Number: 4,479,066
[45] Date of Patent: Oct. 23, 1984

[54] AC/DC CURRENT DIVIDER CIRCUIT

[75] Inventor: Milton L. Embree, Reading, Pa.

[73] Assignee: AT&T Bell Laboratories, Murray Hill, N.J.

[21] Appl. No.: 377,867

[22] Filed: May 13, 1982

Related U.S. Application Data

[63] Continuation of Ser. No. 134,992, Mar. 28, 1980, abandoned.

[51] Int. Cl.³ .............................................. H03K 5/00
[52] U.S. Cl. .................................. 307/350; 307/261; 307/491; 307/493
[58] Field of Search .............. 307/261, 264, 296, 491, 307/493, 350; 328/168, 169, 171, 172, 175, 161; 330/257, 259

[56] References Cited

U.S. PATENT DOCUMENTS

| | | | |
|---|---|---|---|
| 3,410,961 | 11/1968 | Slana | 179/18 |
| 3,504,127 | 3/1970 | Slana | 179/16 |
| 3,772,514 | 11/1973 | Sunderland | 250/217 |
| 3,991,279 | 11/1976 | Morgan et al. | 179/18 |
| 4,045,615 | 8/1977 | James et al. | 179/1 |
| 4,056,719 | 11/1977 | Waaben | 250/199 |
| 4,070,572 | 1/1978 | Summerhayes | 250/199 |
| 4,172,999 | 10/1979 | Leidich | 330/257 |
| 4,190,747 | 2/1980 | Feiner et al. | 179/170 NC |
| 4,228,323 | 10/1980 | Feiner et al. | 179/16 F |

Primary Examiner—John Zazworsky
Attorney, Agent, or Firm—Ronald D. Slusky

[57] ABSTRACT

There is disclosed a circuit, using integrated techniques, for dividing the AC component of an input signal by the DC component of that signal and then multiplying the signal by a fixed DC current. This circuit is useful in opto-coupled gain control devices where the output AC signal must be gain adjusted for the light transfer characteristics of the opto-couplers.

10 Claims, 4 Drawing Figures

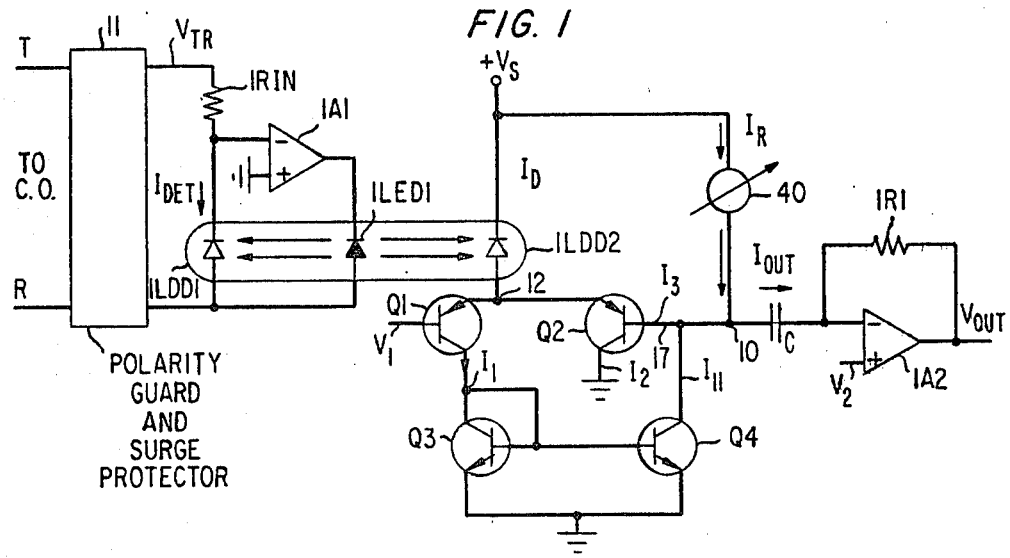

$S = \dfrac{I_1}{I_1 + I_2} =$ Q1 TO Q2 SPLIT RATIO (A)

$I_C = I_S e^{V_{BE}/V_T}$ (B)

$V_T = KT/q \sim 26\,mV\,@\,25°C$ (C)

$S = \dfrac{e^{V_{BE1}/V_T}}{e^{V_{BE1}/V_T} + e^{V_{BE2}/V_T}}$ (D)

$\Delta V_{12} = \Delta V_{BE}(Q1) = \Delta V_{BE}(Q2)$ (E)

$S\big|_{I_D + \Delta I_D} = S\big|_{I_D}$ (F)

WHERE: S = Q1 TO Q2 SPLIT RATIO (B)

$I_D = I_D(dc) + I_D(ac)$ (C)

$\therefore I_1 = SI_D(dc) + SI_D(ac)$ (D)

$I_3 \cong 0,\ I_R(ac) = 0$ (E)

$I_{11} = I_1$ (F)

$\therefore I_{OUT} = I_1(ac) = SI_D(ac)$ (G)

$I_R = I_{11}(dc) = I_1(dc)$ (H)

$S = \dfrac{I_R}{I_D(dc)}$ (I)

$\therefore I_{OUT} = \dfrac{I_R \cdot I_D(ac)}{I_D(dc)}$ (J)

DIVIDER CIRCUIT

AC/DC CURRENT DIVIDER CIRCUIT

This is a continuation of application Ser. No. 134,992 filed Mar. 28, 1980, abandoned.

TECHNICAL FIELD

This invention is directed to a circuit for use in a gain control circuit and is more particularly directed to such a circuit using current divider techniques for output gain control.

BACKGROUND OF THE INVENTION

It sometimes becomes necessary to control the gain of a circuit or device as a function of another circuit parameter. In copending U.S. Pat. No. 4,228,323 issued to Feiner, et al on Oct. 14, 1980, there is disclosed a circuit for gain control of an optocoupled circuit using a DC voltage to control the AC gain of the circuit. In the Feiner patent, a DC reference voltage is used and is compared to the DC component of the control voltage and the error between the compared voltages is used to modify the AC gain of the circuit. The technique, while effective to accomplish the desired result, uses a multiplication circuit and operational amplifiers. Such components are costly and not easily integratable into a high density substrate. Thus, it is desirable to design a circuit for gain control using the DC component of the signal, but to do so with circuitry which is economically incorporable into integrated circuit technology.

SUMMARY OF THE INVENTION

I have recognized that it is possible to accomplish the desired result, namely the proper control of an output AC signal, by dividing the AC current component of an input signal by the DC current component of that signal and then multiplying the result by a fixed current. I have therefore designed a circuit which splits the input current (AC and DC) into subcurrents each having an AC and a DC component. The current split is controlled by the voltage on a node into which a fixed DC current and one of the subcurrents is provided and out of which all AC current components are removed and make up the output current. With this configuration it is possible to achieve the desired result.

The circuit embodiment used to perform the control function is arranged with a control current fed into the node. Also connected to the node is a path for removing DC current equal to the DC component of one of the subcurrents derived from the input signal. Thus, the node is arranged with a fixed DC input current and an output current equal to the DC component of one of the divided subcurrents.

The circuit is arranged so that the split of the input current is determined by the node voltage. As a result, the circuit is self balancing so that the current split is exactly that required to make the DC component of the derived subcurrent equal to the control current. In this circuit if the DC component of the subcurrent is greater than the control current, the split of the input current is changed to reduce the DC component of the subcurrent. Using this approach the circuit continually adjusts to a point where a balance condition between the control DC current and the DC component of the subcurrent exists.

The subcurrents at the node also contains the split AC component of the input signal and this AC signal is available to the output circuit. The AC output of the circuit then is controlled by the DC value of the input signal as well as by the fixed DC current bias fed to the summing node.

Thus, it is one attribute of my invention to provide a circuit which divides the AC input signal current by the DC component of that signal and then multiplies the result by a fixed DC current signal.

It is another attribute of my invention to provide such a circuit for use in communication circuits for gain control.

BRIEF DESCRIPTION OF THE DRAWING

These and other problems are solved in one embodiment of my invention the operation of which will be more fully appreciated from a review of the drawing in which:

FIG. 1 shows a schematic of a communication system having gain control;

FIGS. 2 and 3 show the mathematical relationships between the voltage and currents.

DETAILED DESCRIPTION

Figure 4:
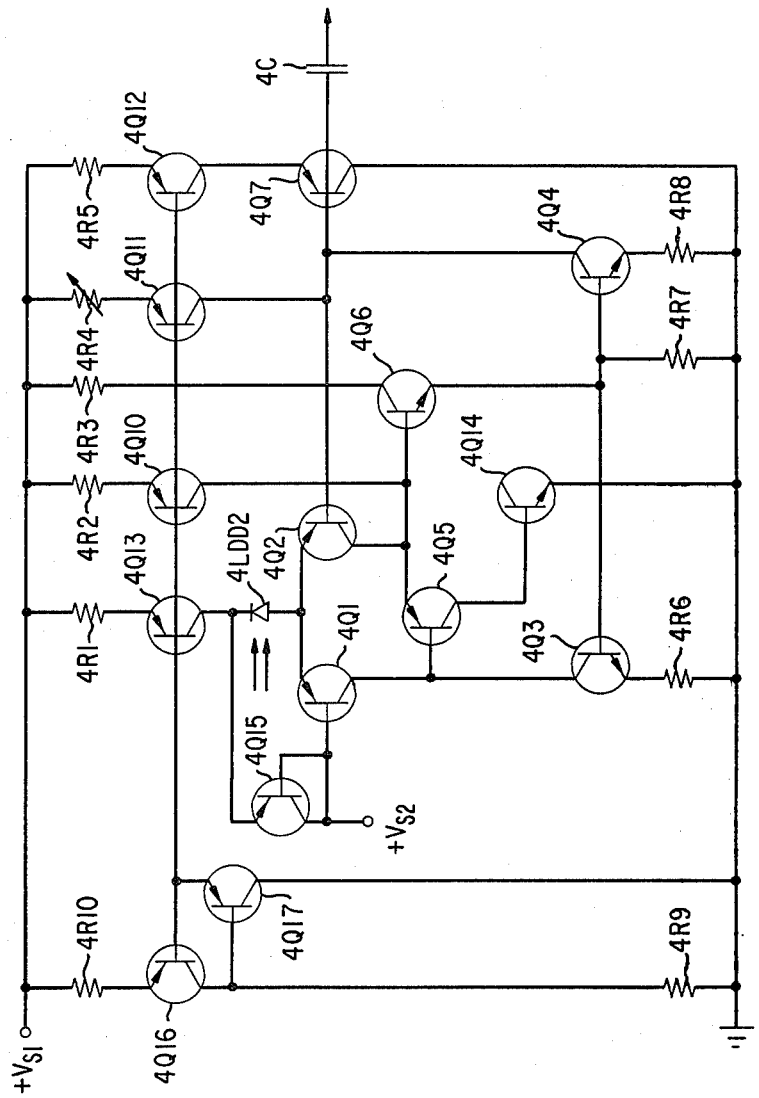
FIG. 4 shows an optimized divider multiplier circuit.

With reference to FIG. 1, communication signals having a certain ac and dc voltage level enter from the central office over the T and R leads and pass through polarity guard and surge protector 11. This type of circuit operation is shown in U.S. Pat. No. 4,228,323 issued to Feiner, et al on Oct. 14, 1980 and U.S. Pat. No. 4,190,747 issued to Feiner, et al on Feb. 26, 1980 which are both hereby incorporated by reference. The aforementioned patents are directed to the use of a DC reference voltage in the output side of the opto barrier to compensate for variations in the coupling characteristics of the circuit. In these circuits advantage is taken of the fact that the DC voltage on the output side of the barrier is a direct function of the transfer characteristics of the barrier and thus the DC voltage may be used to correct the AC signal.

As shown in my FIG. 1, the circuitry on the input side of the barrier operates and functions in the manner detailed in either of the Feiner et al disclosures. Thus, the light generated by photodiode 1Led1 impinges upon photodiodes 1LDD1 and 1LDD2. The purpose of this structure is to correct for nonlinearities in the optocoupled barrier, the operation of which explained in U.S. Pat. No. 4,056,719 issued to S. G. Waaben on Nov. 1, 1977. The aforesaid Waaben patent is hereby incorporated by reference herein.

The photodiode and photodetector serve as an optical barrier between the input side of the circuit and the output side. Light impinging upon photodetector 1LDD2 causes a current $I_D$ having both AC and DC values to flow therethrough. This current is proportional to the ac and dc components of the light as generated by photodiode 1LED1. Thus, at node 12 there is provided current bearing a direct relationship both in its ac and dc component to the light coming across the barrier. Transistors Q1 and Q2 operate in a current splitting fashion so that the sum of current $I_1$ from transistor Q1 and current $I_2$ from transistor Q2, the former having an applied base voltage V1, is approximately equal to the current $I_D$ generated by photodiode 1LDD2. Collector current $I_2$ is passed directly to ground. Current $I_1$ from transistor Q1 is provided to current mirror transistors Q3 and Q4 such that the collector current $I_{11}$ of transistor Q4 substantially equals current $I_1$.

Turning our attention to node 10, it will be seen that due to capacitor C and the virtual ac ground provided by amplifier 1A2 any ac component of any current signals at node 10 passes directly to the input of amplifier 1A2 while this path is blocked to all dc currents. Also note that current $I_R$ is provided by constant current generator 40 which could be a resistor to a positive voltage source. The current $I_R$ is fixed for a particular desired gain range and is supplied into node 10.

Examining the dc currents at node 10, it is seen that current $I_R$ equals the dc component of current $I_{11}$ minus current $I_3$, which is provided on lead 17. Thus, since current $I_1$ depends upon the collector current at transistor Q1, the only current that could change at node 10 to maintain a dc balance condition for the circuit is transistor Q2 base current $I_3$.

Assuming for a moment that current $I_1$ were to be too high, i.e., higher than current $I_R$, then current $I_3$ would have to increase. However, as current $I_3$ increases current $I_2$ also increases thereby decreasing current $I_1$ via transistor Q1. This decrease in current $I_1$ causes a subsequent decrease in current $I_{11}$. Thus, the ratio between currents $I_1$ and $I_2$ continues to be adjusted until current $I_{11}$ comes to the proper preestablished relationship with current $I_R$. Since current $I_{11}$ contains both the ac and dc components of the input signal (as did durrent $I_1$), the ac component is continuously applied via capacitor C to amplifier 1A2 thereby providing a voltage output having an output signal gain adjusted directly in accordance with the fixed dc current $I_R$ and inversely in accordance with the dc component of the input signal current. The circuit of FIG. 1 provides high accuracy if transistor current gains are high enough so that base currents are negligible with respect to collector current. Shown in FIGS. 2 and 3 are the relationships between the various voltages and currents of FIG. 1. S is the split ratio expressed as collector current of Q1 to the sum of the collector currents of Q1 and Q2 which is equal to the input current if the base currents are negligible.

Equation B of FIG. 2 is the relation describing the transistor collector current $I_C$ in terms of the base to emitter voltage $V_{BE}$ where $I_S$ is the transistor saturation current and $V_T$ is the transistor thermal voltage as defined in Equation C. In Equation C, K is Boltzmans constant, T is the absolute temperature and q is the charge of an electron.

Equation D results from the substitution of Equation B in Equation A and cancellation of $I_S$ terms which are equal for matching transistors.

Since the base of transistor Q1 is connected to a voltage source (AC ground) and the base of transistor Q2 is connected through a large coupling capacitor to the negative input of an operational amplifier (a virtual AC ground), an AC voltage variation at the emitters of Q1 and Q2 ($\Delta V_{12}$) results in equal AC variations in $V_{BE}(Q1)$ and $V_{BE}(Q2)$ as described in Equation (E).

By substitution of the change in $V_{12}$, corresponding to a change in $I_D$, into Equation (D), it is seen that the split ratio for variations $\Delta I_D$ around the operating point $I_D$ is equal to the split ratio at the DC operating point. This is shown in Equation (F).

The equations in FIG. 3 develop the expression for the output current $I_{OUT}$ as a function of the AC and DC components of the input current ($I_D$) and the reference current ($I_R$).

The collector current of transistor Q1 is equal to the split ratio S times the input current to the divider circuit $I_D$. This is a simple manipulation of Equation (A) of FIG. 2 and recognition of the assumption that base currents are negligible.

Splitting the input current $I_D$ into its AC and DC components as shown in Equation (C) and substituting in Equation (A) gives Equation (D). Now the base current of Q2 is negligible and the AC voltage at node 10 is zero because the negative input of op amp 1A2 is a virtual ground and the coupling capacitor C is large. Also, the current mirror formed by Q3 and Q4 may be considered perfect if base currents are negligible and the two transistors are matched. Thus the collector current of Q4 ($I_{11}$) is equal to the collector current of Q1($I_1$). By Kirkoff's current law, the AC output current $I_{OUT}$ must be equal to the AC component of the collector current of Q4 since the base current of Q2 is negligible and the reference current has no AC component. Thus, the output current is equal to the AC component of the collector current of Q1 which by Equation (D) is equal to the split ratio S times the AC component of the input current $I_D$[ac]. Also by Kirkoff's current law applied at node 10, the reference current $I_R$ is equal to the DC component of the collector current of Q4 which is equal to the DC component of the collector current of Q1. Combining Equations (H), (D), and (A) we get Equation (I). Substituting from Equation (I) into Equation (G) provides the desired final expression shown as Equation (J). Thus, it becomes evident that the resulting ac output current is then equal to the ac input current $I_D$ times the reference current $I_R$ divided by the dc input current $I_D$.

Of course it is understood that it is possible, by making the fixed current source 40 variable and remotely controllable it would be possible to control the gain of the circuit by controlling the DC current from the remote position.

Referring now to FIG. 4, there is detailed the output side of a linear opto-coupled circuit showing some current correction circuitry. It will be noted that the current mirror is now formed by transistors 4Q3, 4Q5, 4Q6, and 4Q4. This is done in order to correct for some base current errors that would decrease the accuracy of the divider/multiplier action.

The collector current of transistor 4Q2 is made to flow through transistor 4Q5 so that the base current of transistor 4Q5, being a matching NPN transistor, is very nearly equal to the base current of transistor 4Q2, or at least that portion of it which is associated with the collector current of transistor 4Q2. The base current of transistor 4Q5 adds to the collector current of transistor 4Q1, and the base current of transistor 4Q2 adds to the input current from transistor 4Q11, which is current $I_R$ of FIG. 1. Thus, there is provided a cancellation of the effect of the base current of transistor 4Q5 and the base current of transistor 4Q2. Now in order to maintain a high frequency response for the circuit, a reasonable minimum collector current must be maintained for each of the transistors. When the photodiode current is low and the circuit adjusts the split ratio so that most of the current passes through transistor 4Q1 and very little through transistor 4Q2, the current through transistor 4Q5 becomes low enough to degrade the frequency response of the current mirror. To prevent this, a constant current is provided by transistor 4Q10 which adds to the emitter current of 4Q5. This added current increases the base current of 4Q5 which will cause an error if not compensated for. Matching transistor 4Q7 is provided with an equal constant current from transistor 4Q12 so that its base current when added to the reference current $I_R$ from transistor 4Q11 provides the desired compensation. The current sources are set up by conventional current mirror means 4Q16 and 4Q17 using matching transistors and matching degeneration resistors 4R10, 4R1, 4R2, 4R3, 4R4 and 4R5. Variable resistor 4R4 can be used to remotely control the reference current.

Resistor 4R7 provides a reasonable current in transistor 4Q6 so that its frequency response will be reasonable. The base current of transistor 4Q6 is an additional error current, but it is extremely small and is a second-order error.

Resistor 4R9 connects the collector of transistor Q16 and the base of transistor Q17 to ground. Voltage VS2 biases transistors 4Q1 and 4Q5. Diode connected transistor 4Q15 establishes a bias voltage for photodiode 4LDD2.

Transistor 4Q14 is used as a switch to indicate when the photodiode 4LDD2 is illuminated and circuit input current flows.

CONCLUSION

The foregoing description provides one skilled in the art an understanding of my invention and allows one so skilled to practice the invention in the mode contemplated at this time. However, it should be understood that people skilled in the art may make improvements in circuit design by adding or subtracting transistors for the purpose of even further enhancing the accuracy of my circuit without in any way departing from the spirit and scope of my invention. For example, PNP transistors can be replaced by NPN transistors and NPN transistors by PNP transistors. In this case, the positive voltage supplies would be replaced by negative voltage supplies.

What is claimed is:

1. A circuit having an output terminal and an input terminal for accepting an input current having an AC component and a DC component, said circuit comprising means for separating said input current into first and second currents in a controlled proportion, each of said first and second currents having an AC component and a DC component, means responsive to said first current for establishing a control current substantially equal to said first current, said control current having an AC component and a DC component, a source of a DC reference current, said separating means including means responsive to said DC reference current and to said control current for controlling said proportion such that the DC component of said control current is substantially equal to said DC reference current, and means for supplying at said output terminal a signal representing the AC component of said control current.

2. The invention set forth in claim 1 wherein said DC reference current is controllable.

3. The invention set forth in claim 1 wherein said separating means includes first and second transistors having a split ratio S of collector current of said first transistor to total collector current of said both transistors expressed as $I_1$ divided by $I_1$ plus $I_2$, where $I_1$ is the collector current of said first transistor and $I_2$ is the collector current of said second transistor.

4. The invention set forth in claim 3 wherein said controlled proportion means includes the base current of said second transistor.

5. The invention set forth in claim 4 wherein said control current establishing means includes a current mirror circuit.

6. A circuit having an output terminal and an input terminal for accepting an input signal having an AC component and a DC component, said circuit comprising means for separating said input signal into first and second currents in a proportion controlled by a balancing current applied to a control input of said separating means, each of said first and second currents having an AC component and a DC component, a summing node connected to said output terminal, means responsive to said first current for establishing at said summing node a control current substantially equal to said first current, said control current having an AC component and a DC component, means for further establishing at said summing node a reference DC current, means for interconnecting said summing node and said control input to provide said balancing current, and means for providing at said output terminal a signal representing the AC component of said control current.

7. The invention set forth in claim 6 wherein said DC reference current is a controllable current source.

8. The invention set forth in claim 6 wherein said separating means includes first and second transistors having commonly connected emitter electrodes for establishing a split ratio of collector current of said first transistor to total collector current of both transistors expressed as $I_1$ divided by $I_1$ plus $I_2$, where $I_1$ is said collector current of said first transistor and $I_2$ is the collector current of said second transistor.

9. The invention set forth in claim 7 wherein said balancing current is the base current of said second transistor.

10. The invention set forth in claim 9 wherein said control current establishing means includes a current mirror circuit.

* * * * *